US011239382B2

(12) United States Patent
O'Neill et al.

(10) Patent No.: US 11,239,382 B2
(45) Date of Patent: Feb. 1, 2022

(54) SEMICONDUCTOR PHOTOMULTIPLIER

(71) Applicant: SENSL TECHNOLOGIES LTD., Cork (IE)

(72) Inventors: Kevin O'Neill, Blackrock (IE); Liam Wall, Glounthaune (IE); John Carlton Jackson, Cobh (IE)

(73) Assignee: SensL Technologies LTD., County Cork (IE)

( * ) Notice: Subject to any disclaimer, the term of this patent is extended or adjusted under 35 U.S.C. 154(b) by 111 days.

(21) Appl. No.: 16/152,596

(22) Filed: Oct. 5, 2018

(65) Prior Publication Data

US 2019/0044019 A1    Feb. 7, 2019

Related U.S. Application Data

(62) Division of application No. 14/321,487, filed on Jul. 1, 2014, now Pat. No. 10,121,928.

(51) Int. Cl.
*H01L 31/00* (2006.01)
*H01L 31/107* (2006.01)
*H01L 31/0232* (2014.01)
*H01L 27/146* (2006.01)

(52) U.S. Cl.
CPC ........ *H01L 31/107* (2013.01); *H01L 27/1462* (2013.01); *H01L 27/14685* (2013.01); *H01L 31/02327* (2013.01)

(58) Field of Classification Search
CPC ............... H01L 31/107; H01L 27/1462; H01L 27/14685; H01L 31/02327
See application file for complete search history.

(56) References Cited

U.S. PATENT DOCUMENTS

| 6,864,134 | B1 | 3/2005 | Satou et al. |
| 8,829,452 | B1 | 9/2014 | Brown |
| 9,354,370 | B1* | 5/2016 | Erdogan ................ G02B 5/285 |
| 9,608,120 | B2 | 3/2017 | Yamada |
| 2005/0263840 | A1 | 12/2005 | Maeng et al. |
| 2011/0103742 | A1* | 5/2011 | Obara ................... B82Y 20/00 385/27 |
| 2012/0301976 | A1 | 11/2012 | Kuwabara |
| 2014/0117484 | A1 | 5/2014 | Yamamoto et al. |
| 2014/0312448 | A1* | 10/2014 | Harmon ........... H01L 27/14643 257/438 |
| 2015/0340277 | A1 | 11/2015 | Kuehn et al. |
| 2016/0122237 | A1 | 5/2016 | Mahieu et al. |

* cited by examiner

*Primary Examiner* — Mounir S Amer
*Assistant Examiner* — Alexander Belousov
(74) *Attorney, Agent, or Firm* — Polansky & Associates, P.L.L.C.; Paul J. Polansky

(57) ABSTRACT

A semiconductor photomultiplier includes a microcell, a photosensitive diode, and an anti-reflective coating. The microcell has an insulating layer formed over an active region. The photosensitive diode is formed in the active region beneath the insulating layer. The anti-reflective coating is provided on the insulating layer.

20 Claims, 11 Drawing Sheets

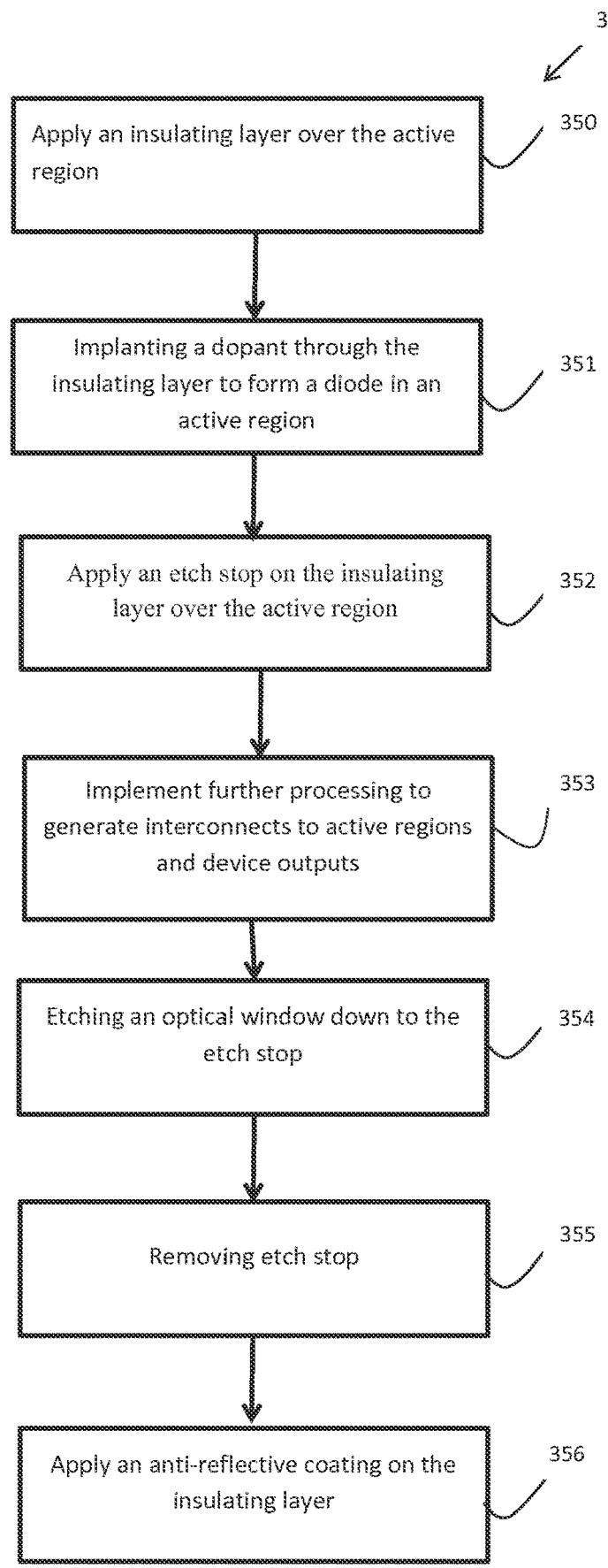

SEMICONDUCTOR PHOTOMULTIPLIER

FIELD

The present disclosure relates to photon detectors. In particular, the present disclosure relates to high sensitivity photon detectors such as semiconductor photomultipliers. In particular, but not exclusively, the present disclosure relates to semiconductor photomultipliers (SiPMs or SPMs) in such areas as Positron Emission Tomography [PET], including Time-Of-Flight PET [TOF-PET], Laser Ranging [LIDAR] applications, bio luminescence, High Energy Physics [HEP] detectors.

BACKGROUND

SiPMs are semiconductor photon sensitive devices made up of an array of very small Geiger-mode avalanche photodiode (APD) cells on a substrate such as silicon. An example 10×10 microcell array is shown in FIG. 1 of the accompanying drawings. Each cell is connected to one another to form one larger device with one signal output. The entire device size can be as small as 1×1 mm or much larger. FIG. 2 of the accompanying drawings is a schematic diagram of a conventional silicon photomultiplier.

APD cells vary in dimension from 10 to 100 microns depending on the mask used and can have a density of up to 3000 microcells/sq. mm Avalanche diodes can also be made from other semiconductors besides silicon, depending on the properties that are desirable. Silicon detects in the visible and near infrared range, with low multiplication noise (excess noise). Germanium (Ge) detects infrared to 1.7 µm wavelength but has high multiplication noise. InGaAs (Indium Gallium Arsenide) detects to a maximum wavelength of 1.6 µm, and has less multiplication noise than Ge. InGaAs is generally used for the multiplication region of a heterostructure diode, is compatible with high speed telecommunications using optical fibres, and can reach speeds of greater than Gbit/s. Gallium nitride operates with UV light. HgCdTe (Mercury Cadmium Telluride) operates in the infrared, to a maximum wavelength of about 14 µm, requires cooling to reduce dark currents, and can achieve a very low level of excess noise.

Silicon avalanche diodes can function with breakdown voltages of 20 to 500V, typically. APDs exhibit internal current gain effect of about 100-1000 due to impact ionization, or avalanche effect, when a high reverse bias voltage is applied (approximately 20-200 V in silicon, depending on the doping profile in the junction). Silicon Photomultipliers or SiPMs can achieve a gain of $10^5$ to $10^6$ by using Geiger mode APDs which operate with a reverse voltage that is greater than the breakdown voltage, and by maintaining the dark count event rate at a sufficiently low level. The current generated by an avalanche event must be quenched by an appropriate current limited scheme so that the device can recover and reset after an avalanche event.

In order to maximize the transmission of light into the active p-n region, it is necessary in prior art arrangements to remove an oxide layer formed over an active region during manufacturing and to deposit an anti-reflective coating over the active region once the oxide layer has been removed. Removing the oxide layer results in some damage to the active area of the device which increases noise. This is undesirable.

There is therefore a need to provide for a process of manufacturing a photomultiplier microcell which addresses at least some of the drawbacks of the prior art.

SUMMARY

In one aspect a process of manufacturing a photomultiplier microcell is described; the process comprising:
providing an insulating layer over an active region; and
implanting a dopant through the insulating layer to form a photosensitive diode in the active region; wherein the insulating layer once formed is retained over the active region throughout the manufacturing process.

In an exemplary arrangement, an epitaxial layer is provided intermediate the insulating layer and a substrate.

In one aspect, the insulating layer is formed directly on a surface of the substrate.

In another aspect, the insulating layer is formed directly on the epitaxial layer.

In one exemplary arrangement, the photomultiplier microcell is a silicon photomultiplier microcell.

In a further aspect, the insulating layer comprises an oxide material.

In another aspect, an anti-reflective coating is provided on the insulating layer.

In one exemplary arrangement, an optical pathway is provided for facilitating the transmission of light to the active region through the insulating layer. Advantageously, the optical pathway is formed by etching a trench into a dielectric layer.

In one example, an etch stop is formed on the insulating layer. Advantageously, the etch stop is removed after the trench has been formed.

In another aspect, the process includes forming a quench resistor which is associated with the photosensitive diode.

In one aspect, the anti-reflective coating comprises a combination of a plurality of materials. Advantageously, the anti-reflective coating comprises a combination of silicon oxide ($SiO_2$) and silicon nitride ($Si_3N_4$).

In one exemplary arrangement, the anti-reflective coating comprises multiple layers of two or more materials.

In another aspect, the anti-reflective coating comprises a layer of 144 nm thick $SiO_2$ and a layer of 45 nm thick $Si_3N_4$.

In a further arrangement, the anti-reflective coating comprises a first layer of 144 nm thick $SiO_2$, a layer of 45 nm thick $Si_3N_4$ and a second layer of 144 nm thick $SiO_2$.

In yet another aspect, the anti-reflective coating comprises a layer of 36 nm thick SiO and a layer of 16 nm thick SiN.

In one aspect, the anti-reflective coating has a thickness of a 1/1 the wavelength of interest divided by the refractive index of the anti-reflective coating. Advantageously, the refractive index of anti-reflective coating is between the refractive index of silicon and the refractive index of the insulating layer.

In another aspect, the refractive index of the anti-reflective coating is the geometric mean of the refractive index of silicon and the refractive index of the insulating layer.

In one aspect, the dopant is applied using ion implantation. In one example, the dopant is a P type material. In another example, the dopant is an N type material.

In one exemplary arrangement, the insulating layer has a thickness in the range of 10 nm to 50 nm. Advantageously, the insulating layer comprises silicon nitride.

In another aspect, the anti-reflective coating comprises silicon oxide.

In one aspect, the anti-reflective coating has a thickness in the range of 10 nm to 50 nm.

In a further aspect, the anti-reflective coating comprises SiO with a thickness of 36 nm and SiN with a thickness in the range of 10 nm-45 nm.

The present disclosure also relates to a semiconductor photomultiplier comprising:
 a macrocell having an insulating layer formed over an active; and
 a photosensitive diode formed in the active region beneath the insulating layer.

These and other features will be better understood with reference to the followings Figures which are provided to assist in an understanding of the present teaching.

BRIEF DESCRIPTION OF THE DRAWINGS

The present teaching will now be described with reference to the accompanying drawings in which:

FIG. 3 is a flow chart illustrating exemplary steps for manufacturing a semiconductor photomultiplier in accordance with the present teaching.

DETAILED DESCRIPTION OF THE DRAWINGS

Figure 1:
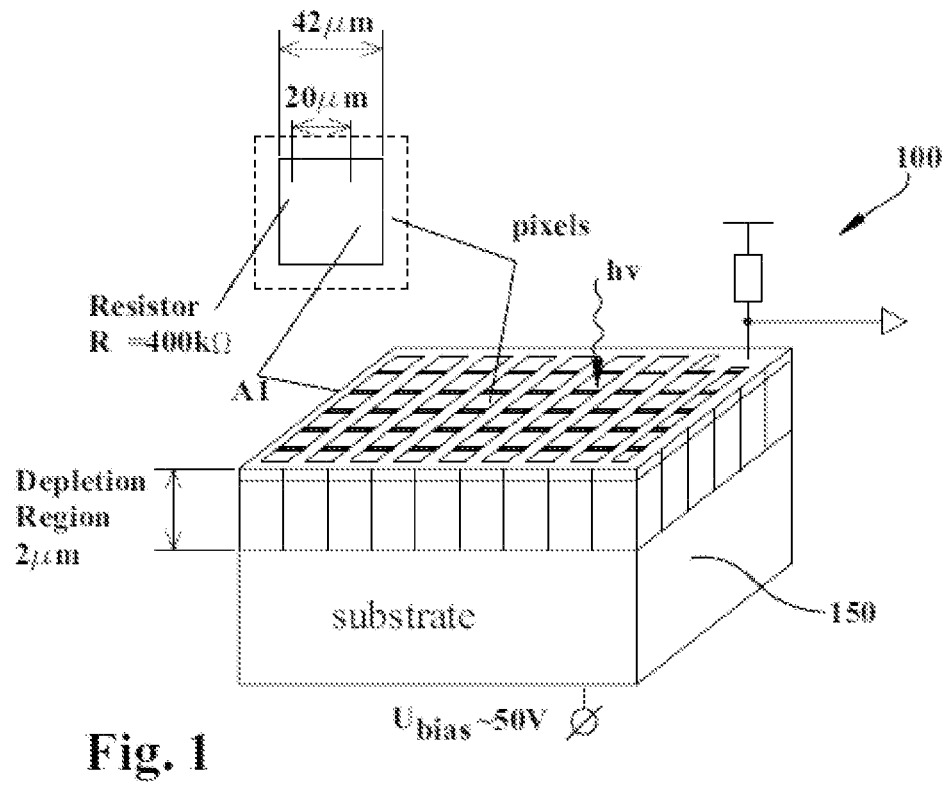
FIG. 1 illustrates an exemplary structure of a silicon photomultiplier.

The present disclosure will now be described with reference to an exemplary semiconductor photomultiplier. It will be understood that the exemplary semiconductor photomultiplier is provided to assist in an understanding of the teaching and is not to be construed as limiting in any fashion. Furthermore, circuit elements or components that are described with reference to any one Figure may be interchanged with those of other Figures or other equivalent circuit elements without departing from the spirit of the present teaching. It will be appreciated that for simplicity and clarity of illustration where considered appropriate, reference numerals may be repeated among the figures to indicate corresponding or analogous elements.

Figure 2:
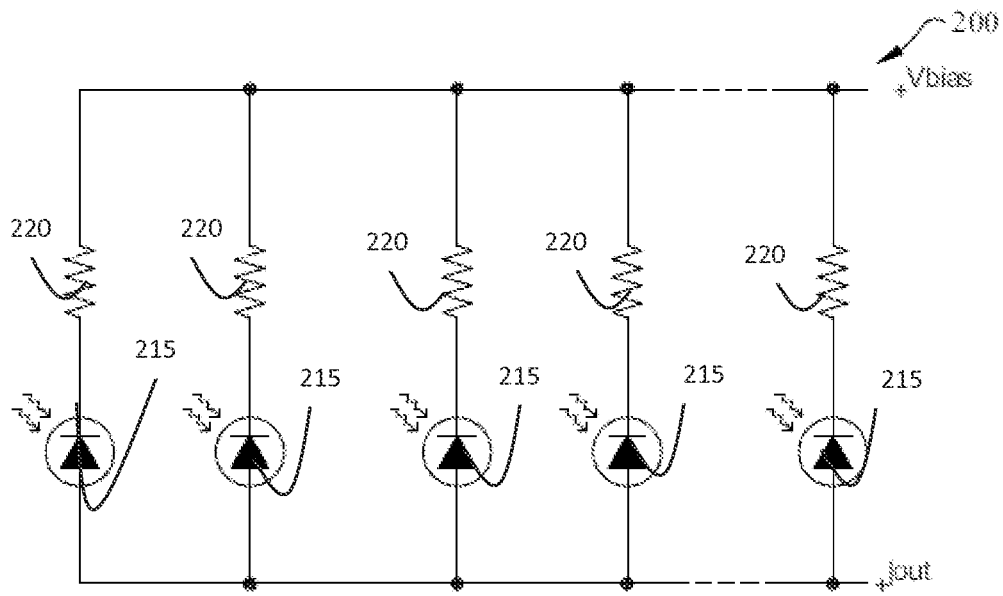
FIG. 2 is a schematic circuit diagram of an exemplary silicon photomultiplier.
Figure 4A:
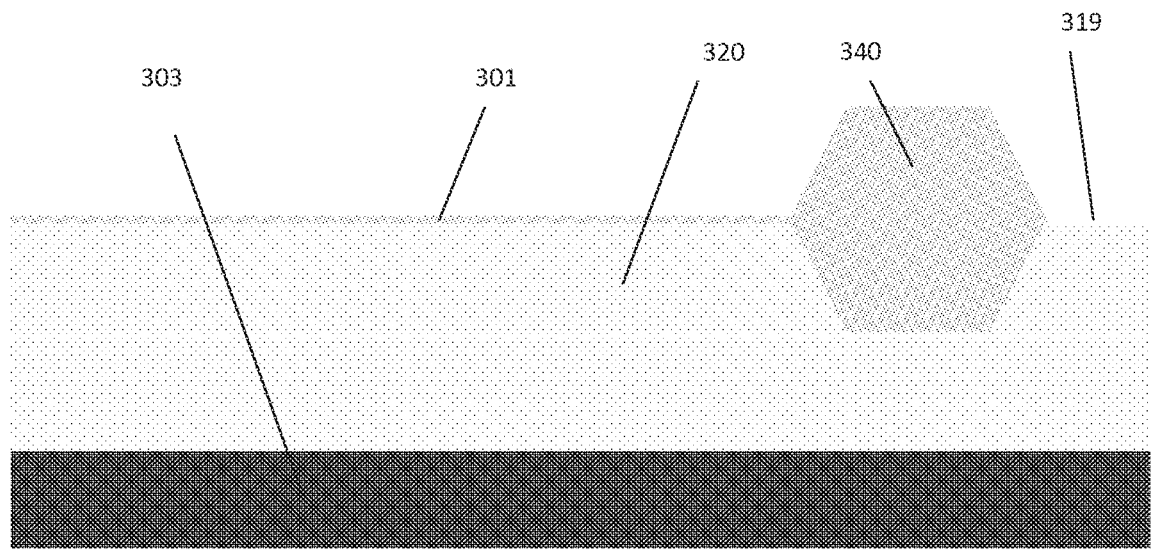
FIG. 4A is a cross sectional view of a semiconductor photomultiplier which is fabricated using the method of FIG. 3.
Figure 4B:
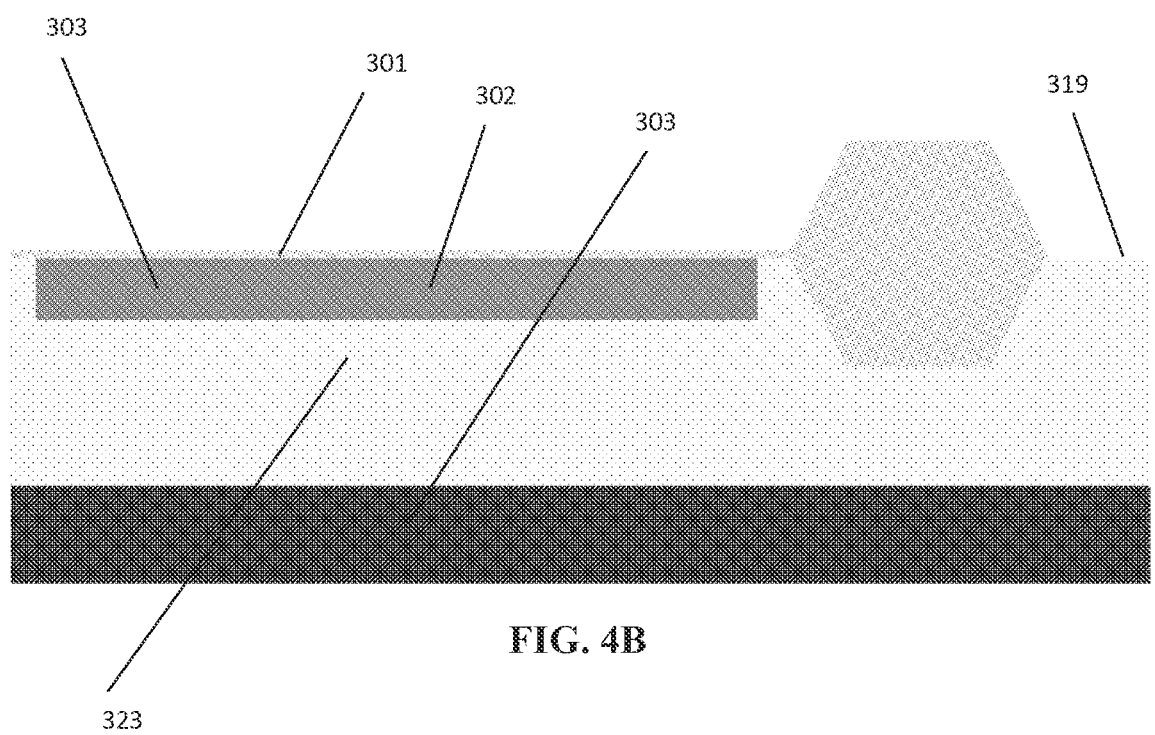
FIG. 4B is a cross sectional view of a semiconductor photomultiplier which is fabricated using the method of FIG. 3.
Figure 4C:
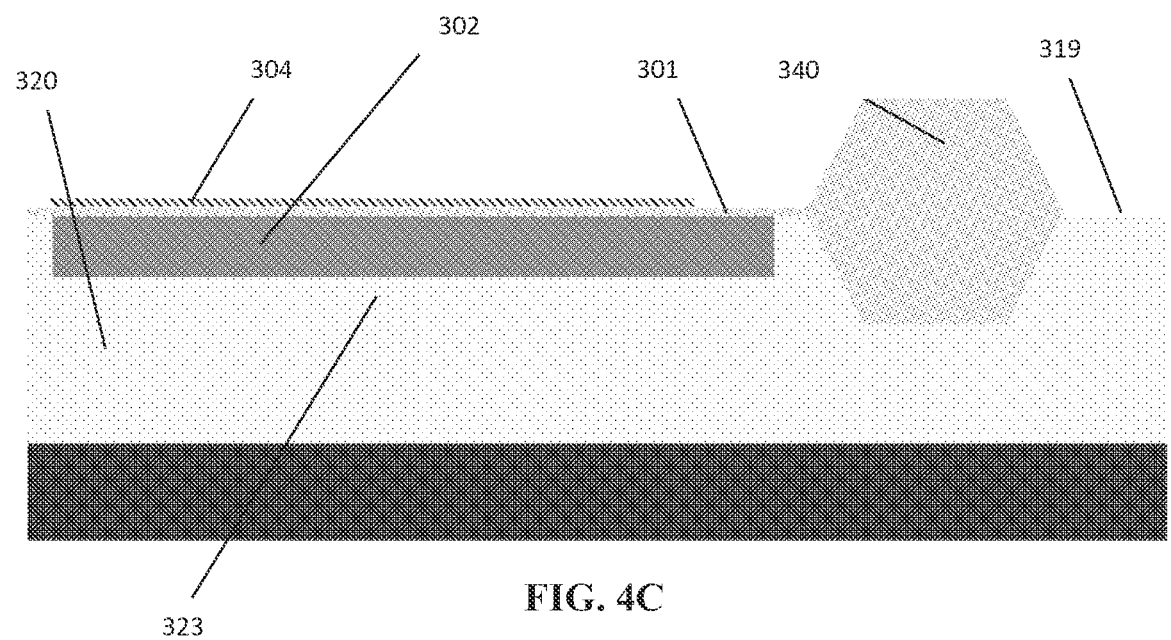
FIG. 4C is a cross sectional view of a semiconductor photomultiplier which is fabricated using the method of FIG. 3.
Figure 4D:
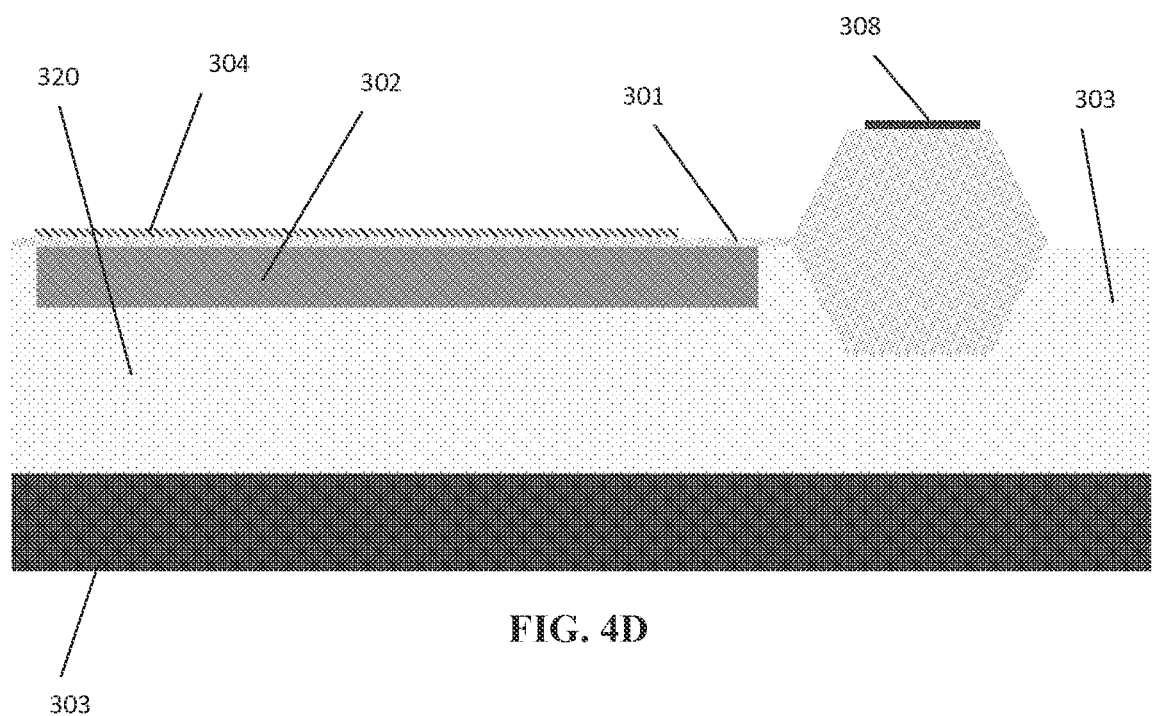
FIG. 4D is a cross sectional view of a semiconductor photomultiplier which is fabricated using the method of FIG. 3.
Figure 4E:
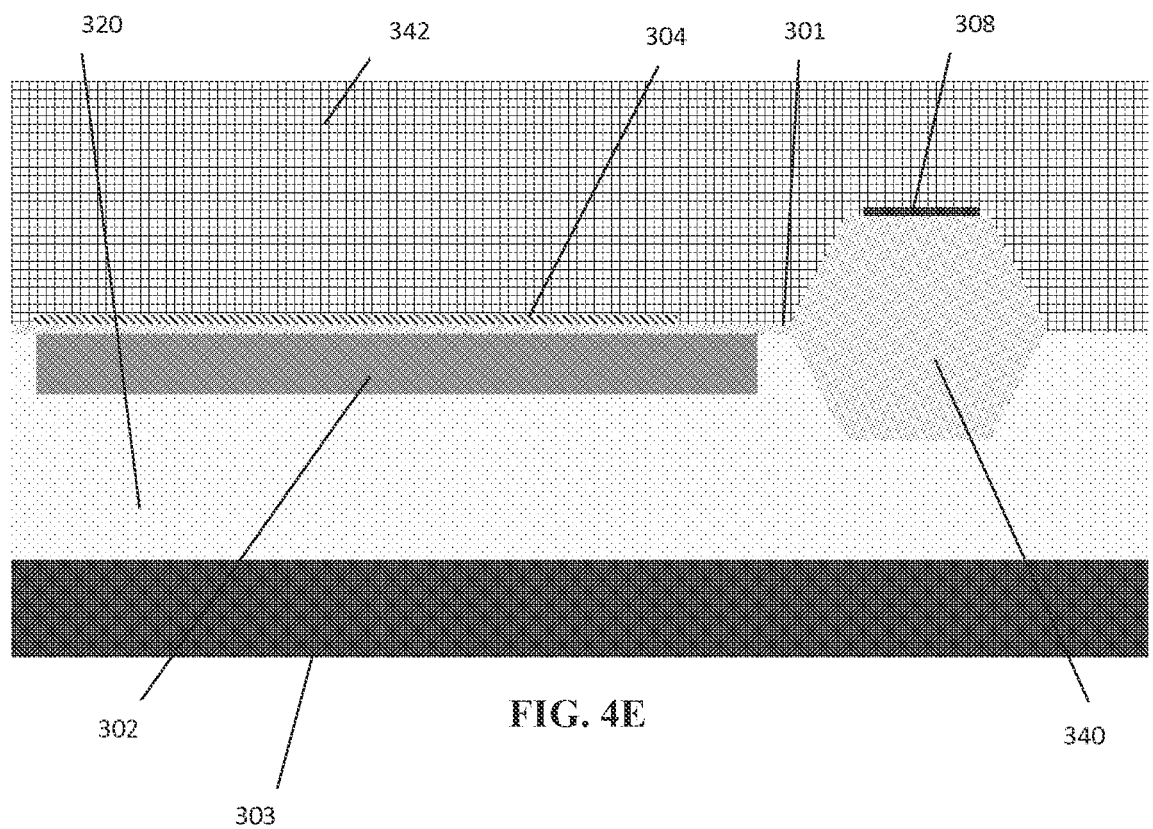
FIG. 4E is a cross sectional view of a semiconductor photomultiplier which is fabricated using the method of FIG. 3.
Figure 4F:
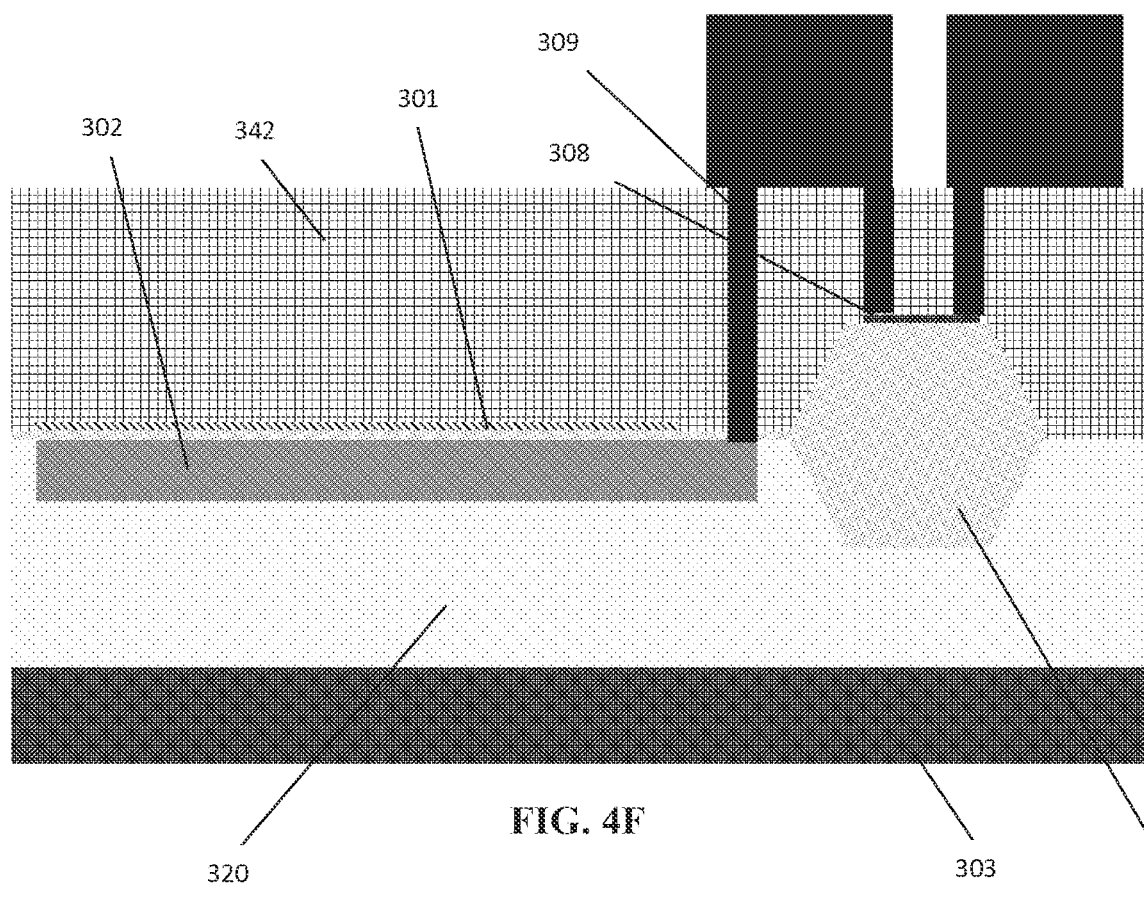
FIG. 4F is a cross sectional view of a semiconductor photomultiplier which is fabricated using the method of FIG. 3.
Figure 4G:
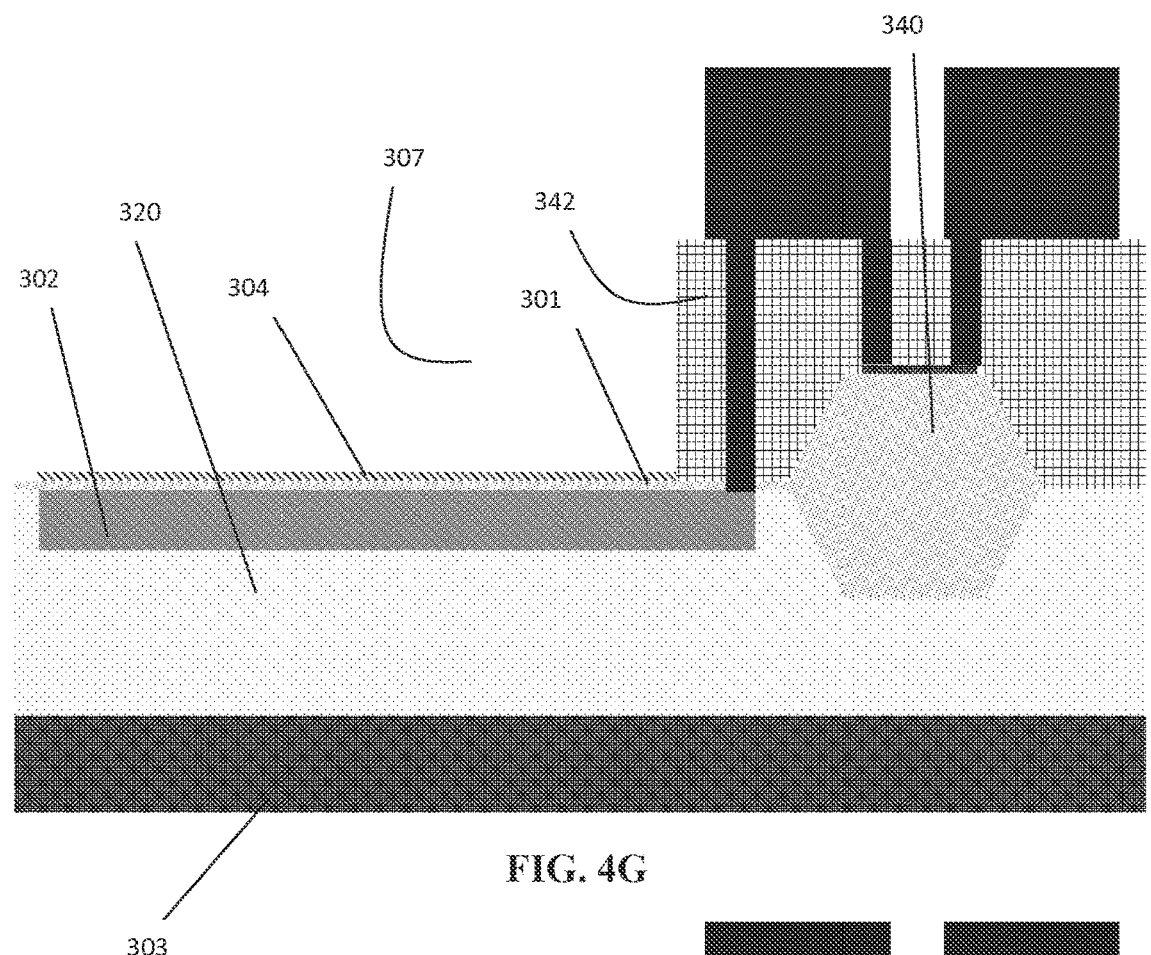
FIG. 4G is a cross sectional view of a semiconductor photomultiplier which is fabricated using the method of FIG. 3.
Figure 4H:
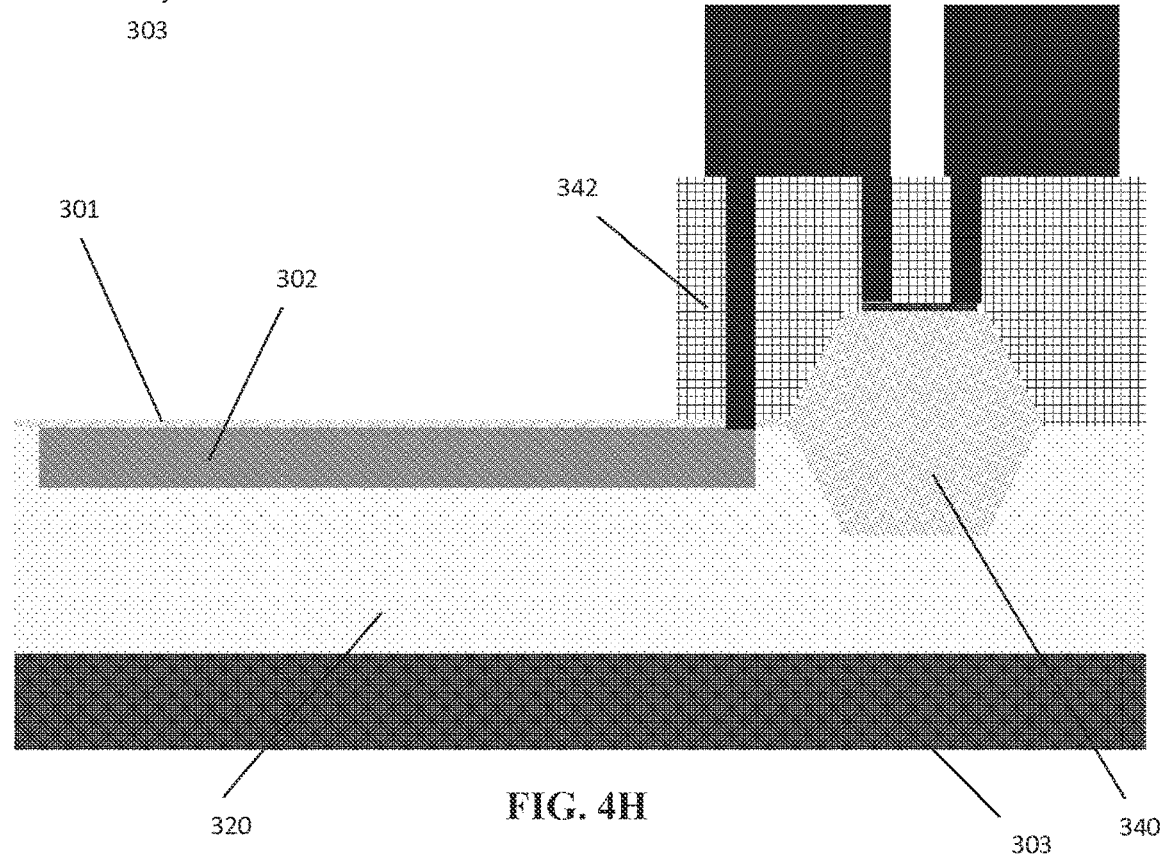
FIG. 4H is a cross sectional view of a semiconductor photomultiplier which is fabricated using the method of FIG. 3.
Figure 4I:
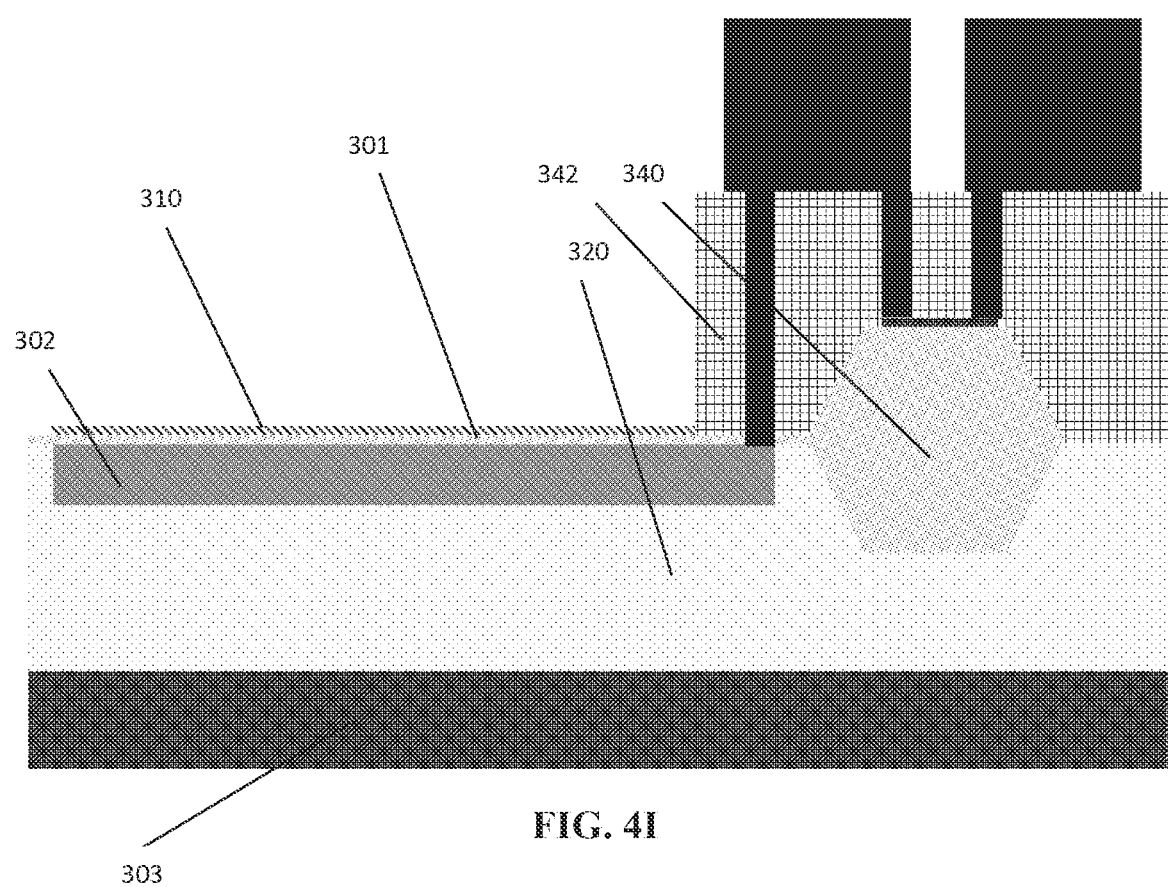
FIG. 4I is a cross sectional view of a semiconductor photomultiplier which is fabricated using the method of FIG. 3.
Figure 4J:
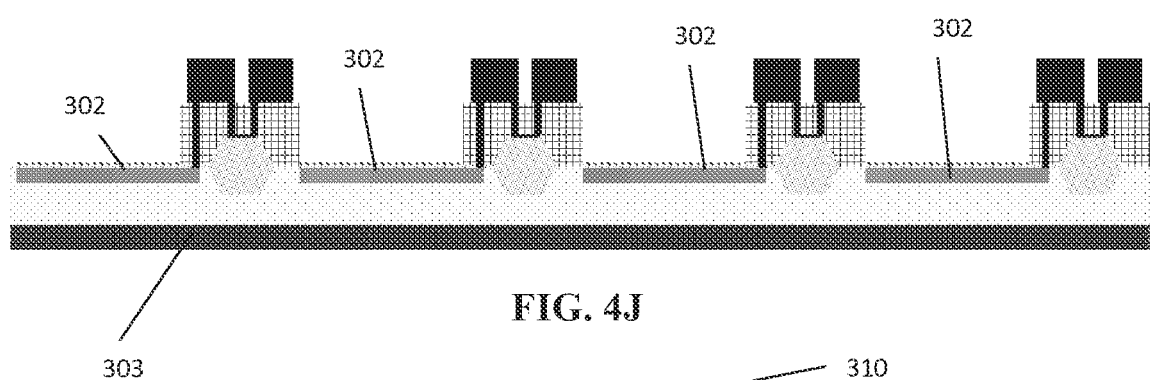
FIG. 4J is a cross sectional view of a plurality of interconnected semiconductor photomultiplier microcells which are fabricated using the method of FIG. 3.

Referring initially to FIG. 1, a silicon photomultiplier 100 comprising an array of Geiger mode photodiodes is shown. As illustrated, a quench resistor is provided adjacent to each photodiode which may be used to limit the avalanche current. The photodiodes are electrically connected to common biasing and ground electrodes by aluminium or similar conductive tracking. An equivalent circuit schematic is shown in FIG. 2 for a conventional silicon photomultiplier 200 in which the anodes of an array of photodiodes are connected to a common ground electrode and the cathodes of the array are connected via current limiting resistors to a common bias electrode for applying a bias voltage across the diodes.

The silicon photomultiplier 100 integrates a dense array of small, electrically and optically isolated Geigermode photodiodes 215. Each photodiode 215 is coupled in series to a quench resistor 220. Each photodiode 215 is referred to as a microcell. The number of microcells typically number between 100 and 3000 per mm². The signals of all microcells are then summed to form the output of the SiPM 200. A simplified all microcells are then summed to form the output of the SiPM 200. A simplified electrical circuit is provided to illustrate the concept in FIG. 2. Each microcell detects photons identically and independently. The sum of the discharge currents from each of these individual binary detectors combines to fix a quasi-analog output, and is thus capable of giving information on the magnitude of an incident photon flux.

Each microcell generates a highly uniform and quantized amount of charge every time the microcell undergoes a Geiger breakdown. The gain of a microcell (and hence the detector) is defined as the ratio of the output charge to the charge on an electron. The output charge can be calculated from the over-voltage and the microcell capacitance.

$$G = \frac{C \cdot \Delta V}{q}$$

Where:
G is the gain of the microcell;
C is the capacitance of the microcell;
ΔV is the over-voltage; and
q is the charge of an electron.

The present disclosure describes a method of manufacturing a semiconductor photomultiplier 100. The array of photodiodes 215 are found on a semiconductor substrate 150 using semiconductor processes which will be known to one skilled in the art and may include for example, but not limited to, deposition, implantation, diffusion, patterning, doping, and etching. Patterned layers of conducting material, insulating material and doped areas of semiconductor form the structure of the photodiode.

Referring to FIGS. 3 and 4 there is illustrated an exemplary method of manufacturing a semiconductor photomultiplier 100. An insulating layer 301 is formed over an active region 302 of a substrate 319, step 350. The insulating layer 301 is provided to prevent co-sputtering of metal ions from the surface to the active area 302, and to randomize the momentum of the incoming ions, which otherwise may penetrate deep into the silicon through channeling. In the exemplary arrangement, the substrate 319 comprises a highly conductive substrate region 303 with a low doped epitaxial layer 320 provided thereon. The insulating layer 301 is typically 10 nm-80 nm in thickness. The insulating layer 301 once formed is retained over the active region throughout the manufacturing process to reduce the risk of damaging the active region 302. Dopant is implanted through the insulating layer 301 to form a photosensitive diode 215 in the active region 302, step 351.

An etch stop 304 is applied over an active region 302 on the insulating layer 301, at step 352. A further oxide layer 340 may be applied and further processing steps performed to accommodate interconnects 309 to the active regions 302 and device outputs, step 353. The further processing includes forming a resistor 308 which provides the quench resistor. The resistor 308 may be provided as polycrystalline film of silicon which is formed by low pressure chemical vapour deposition which may be patterned and doped to create the resistor 308 which functions as a quench resistor. An optical window 307 is etched into a dielectric layer 342 down to the etch stop 304, step 354. The etch stop 304 is then removed, step 355. An anti-reflective material 310 may be coated over the insulating layer 301, step 356. In the exemplary arrangement, the insulating layer 301 may be a silicon oxide layer which is formed by thermal oxidation. The oxide layer 340 may be a silicon oxide layer which is formed by plasma deposition.

The SiPM device comprises a trench which defines an optical pathway 307 which is in registration with the active region 302. The optical pathway is formed by etching a trench into dielectric layer 342 down to the insulating layer 301. The active region may comprise a p-n or n-p diode. The diode includes a high-concentration shallow p or n doped silicon region and a low-concentration deep n or p doped silicon region. These doped regions are implanted through the insulating layer 301 using ion implantation. For example, for silicon, a typical p type implant is boron and typical n-type implant is phosphorous.

The substrate region 303 may be highly doped for providing a low resistivity bulk region. The epitaxial layer 320 is a low doped, low defectivity, epitaxially grown silicon layer in which the Avalanche Photo diodes are formed. Beneath the active region 302 there is a P+Avalanche Photo Diode junction/Zener zone 323 which is the PN junction with specific implanted dopants to create a Geiger Mode Avalanche Photo Detector. While the active region 302 has been described as being formed in the epitaxial layer, it is envisaged that the active region 302 may be formed directly on the surface of the substrate 303 with the epitaxial layer 320 omitted.

Typically, in order to maximize the transmission of light into the silicon active region 302, it was necessary to remove the insulating layer and to deposit an anti-reflective coating (ARC) of thickness ¼ the wavelength of interest, divided by the refractive index of the ARC material, which must be between the refractive index of the silicon and the material placed above (typically air). The optimum refractive index $n_2$ is the geometric mean of the two, given by the formula $n_2 = \sqrt{n_1 n_3}$. For silicon, this would require a refractive index in the range 1.9-2.7. However, removing the insulating layer results in some damage to the active region 302 which increases the noise of the device. The insulating layer is typically removed in order to maximize the signal through light transmission, due to the low refractive index of 1.5. This generates the optimal transmission of light through thin-film interference from outside to inside the active 302 of the SiPM device.

The present disclosure eliminates the step of removing the insulating layer 301, and instead uses an insulating layer 301 having optical properties similar to an anti-reflective coating. Thus, in order to maximize the transmission of light into the active region 302, it is not necessary to remove an oxide layer 301 thereby reducing the risk of damaging active region. Additionally, higher bias voltage may also be used to increase the photon detection efficiency (PDE) in the device, while still retaining low noise and low background current characteristics.

Figure 5A:
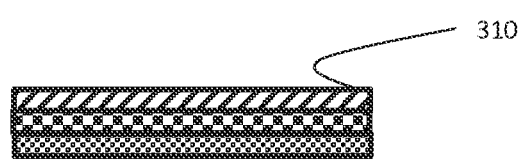
FIG. 5A is a cross sectional view of an anti-reflective coating comprising three distinct layers.
Figure 5B:
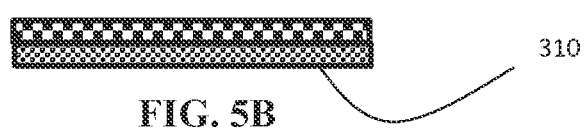
FIG. 5B is a cross sectional view of an anti-reflective coating comprising two distinct layers.

In an exemplary embodiment, an anti-reflective coating 310 comprising a combination of a plurality of materials is provided on top of the insulating layer 301 in order to further maximize the transmission of light into the active region 302. The anti-reflective coating (ARC) may comprise a combination of silicon oxide ($SiO_2$) and silicon nitride ($Si_3N_4$). The ARC may be a lamination including two or more distinct layers. FIG. 5A illustrates an ARC coating comprising three distinct layers, and FIG. 5B illustrates an ARC coating comprising two distinct layers. For example, the anti-reflective coating may comprise a layer of 144 nm thick $SiO_2$ and a layer of 45 nm thick $Si_3N_4$. In another example, the anti-reflective coating may comprise a first layer of 144 nm thick Si 02, a layer of 45 nm thick $Si_3N_4$ and a second layer of 144 nm thick Si 02. In a further example, the anti-reflective coating may comprise a layer of 36 nm thick SiO and a layer of 16 nm thick SiN.

Figure 6:
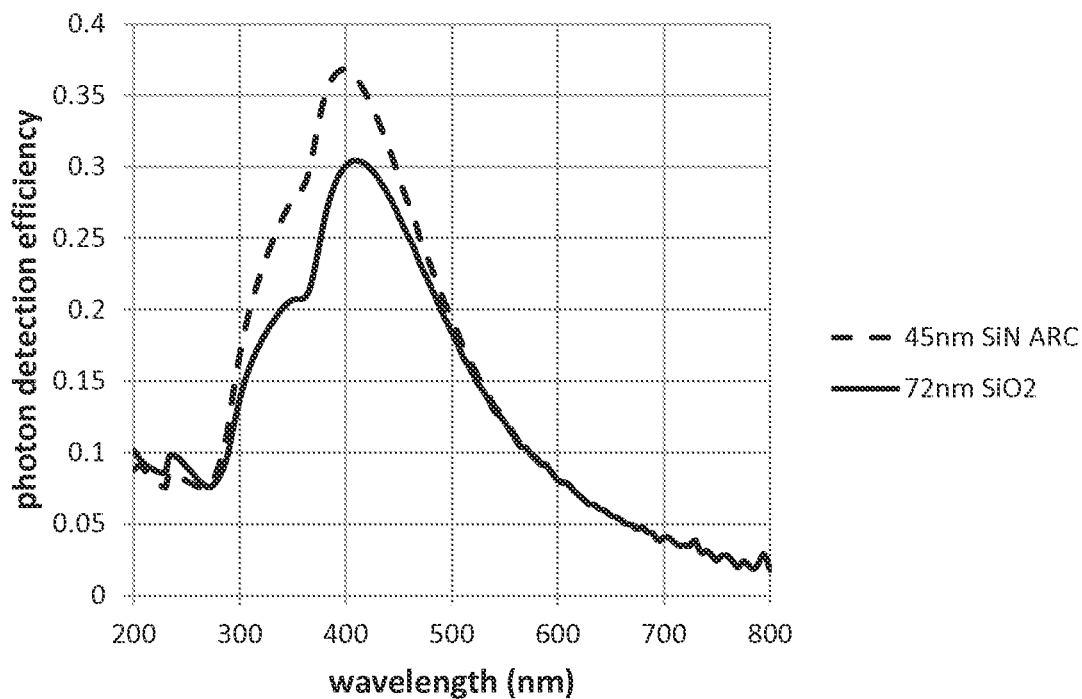
FIG. 6 is a graph illustrating the impact on the photon detection efficiency of the SiPM device by altering the properties of the anti-reflective coating to have different layers of material and thickness combinations.

FIG. 6 is a graph illustrating the photon detection efficiency (PDE) of a microcell plotted against the wavelength of light from 200 nm to 800 nm. The continuous line represents a PDE for a microcell with an insulating layer 301 of silicon oxide with a thickness of 72 nm. The broken line represents a PDE for a prior microcell that has the insulating layer 301 removed during processing and uses an anti-reflective coating of silicon nitride with a thickness of 45 nm over the active region 302. The optimum PDE occurs at approximately 400 nm for both the continuous and broken lines. The maximum PDE of the continuous line is significantly less than the maximum PDE of broken line at the wavelength 400 nm.

Figure 7:
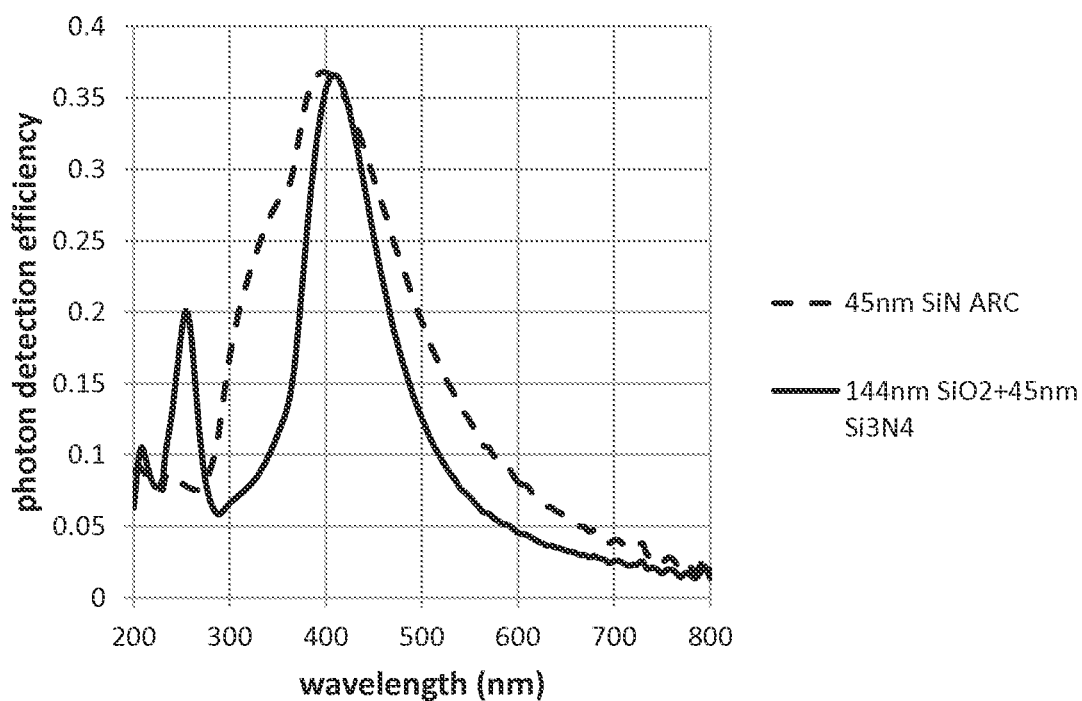
FIG. 7 is a graph illustrating the impact on the photon detection efficiency of the SiPM device by altering the properties of the anti-reflective coating to have different layers of material and thickness combinations.

FIG. 7 is a graph illustrating the photon detection efficiency (PDE) of a microcell plotted against the wavelength of light from 200 nm to 800 nm. The continuous line represents a PDE for a microcell in accordance with the present teaching with an insulating layer 301 retained over the active region 302 and consisting of two layers, namely, a first layer of silicon oxide with a thickness of 144 nm and a second layer of silicon nitride with a thickness of 45 nm. The broken line represents a PDE for a prior art microcell that has the insulating layer 301 removed during processing and uses an anti-reflective coating of silicon nitride with a thickness of 45 nm over the active region 302. The optimum PDE occurs at approximately 400 nm for both the continuous and broken lines. The maximum PDE of the continuous line and the broken line are substantially equivalent at the wavelength 400 nm which demonstrates that the PDE of the microcell may be optimised while retaining the insulating layer 301 by appropriately selecting an anti-reflective coating on top of insulating layer 301 which has an appropriate combination of materials.

Figure 8:
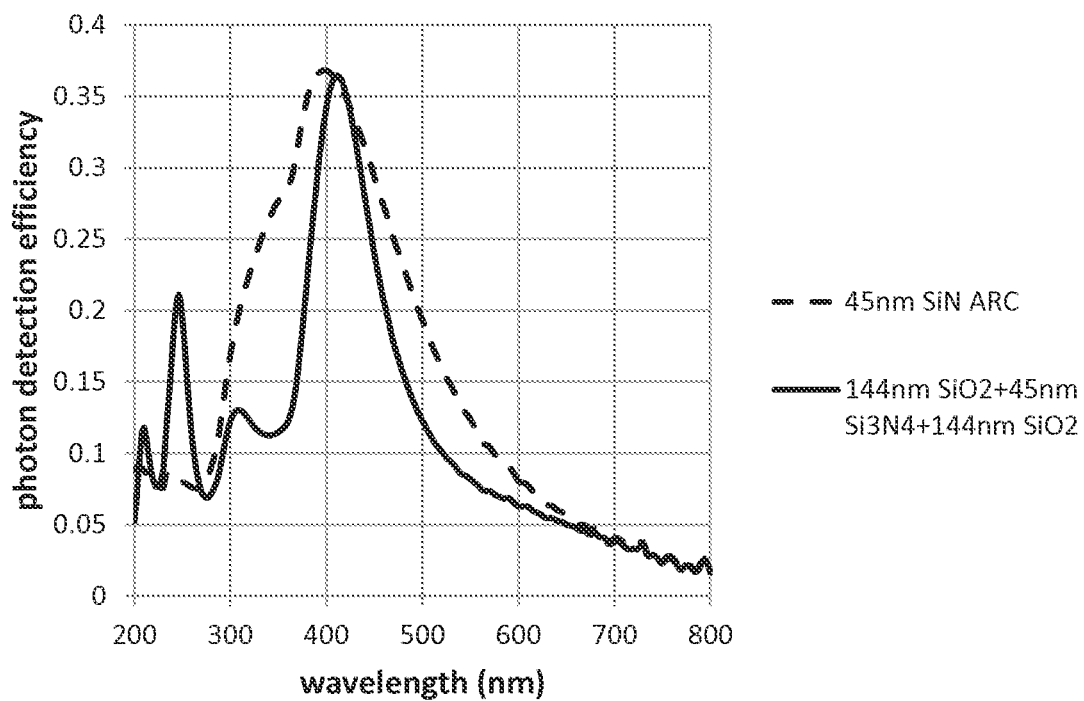
FIG. 8 is a graph illustrating the impact on the photon detection efficiency of the SiPM device by altering the properties of the anti-reflective coating to have different layers of material and thickness combinations.

FIG. 8 is a graph illustrating the photon detection efficiency (PDE) of a microcell plotted against the wavelength of light from 200 nm to 800 nm. The continuous line represents a PDE for a microcell in accordance with the present teaching with an insulating layer 301 retained over the active region 302 and consisting of three layers of material, namely, a first layer of $SiO_2$ with a thickness of 144 nm, a second layer silicon nitride with a thickness of 45 nm, and a third layer of silicon oxide with a thickness of 144 nm. The broken line represents a PDE for a prior art microcell that has the insulating layer 301 removed during processing and uses an anti-reflective coating of silicon nitride with a thickness of 45 nm over the active region 302. The maximum PDE of the continuous line and the broken line are substantially equivalent at the wavelength 400 nm which demonstrates that the PDE of the microcell may be optimised while retaining the insulating layer 301 by appropriately selecting an anti-reflective coating on top of insulating layer 301 which has an appropriate combination of materials.

Figure 9:
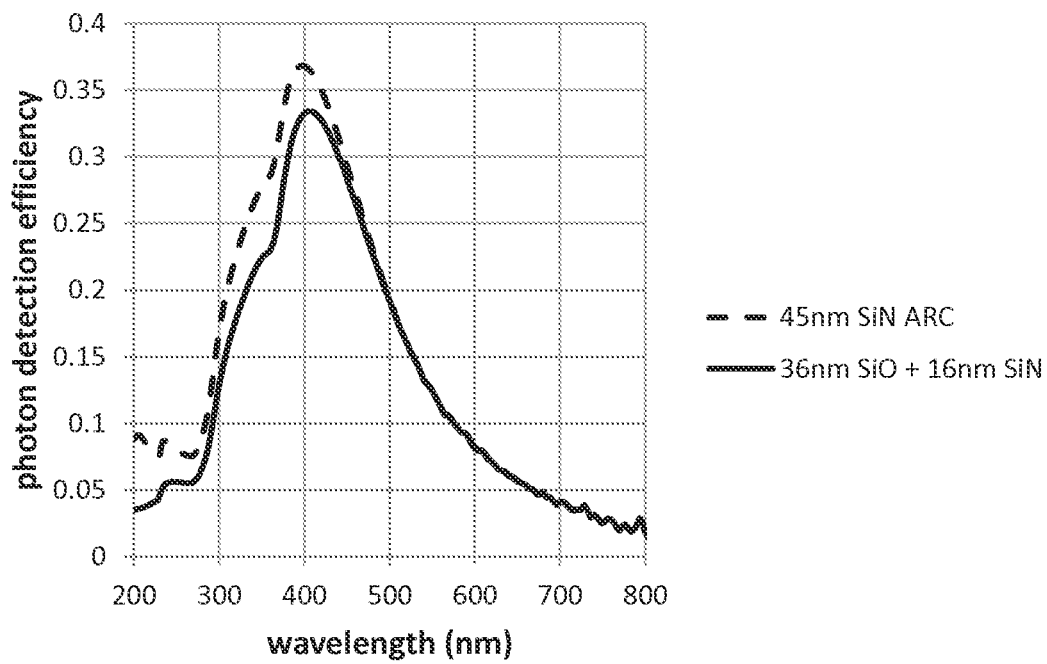
FIG. 9 is a graph illustrating the impact on the photon detection efficiency of the SiPM device by altering the properties of the anti-reflective coating to have different layers of material and thickness combinations.
Figure 10:
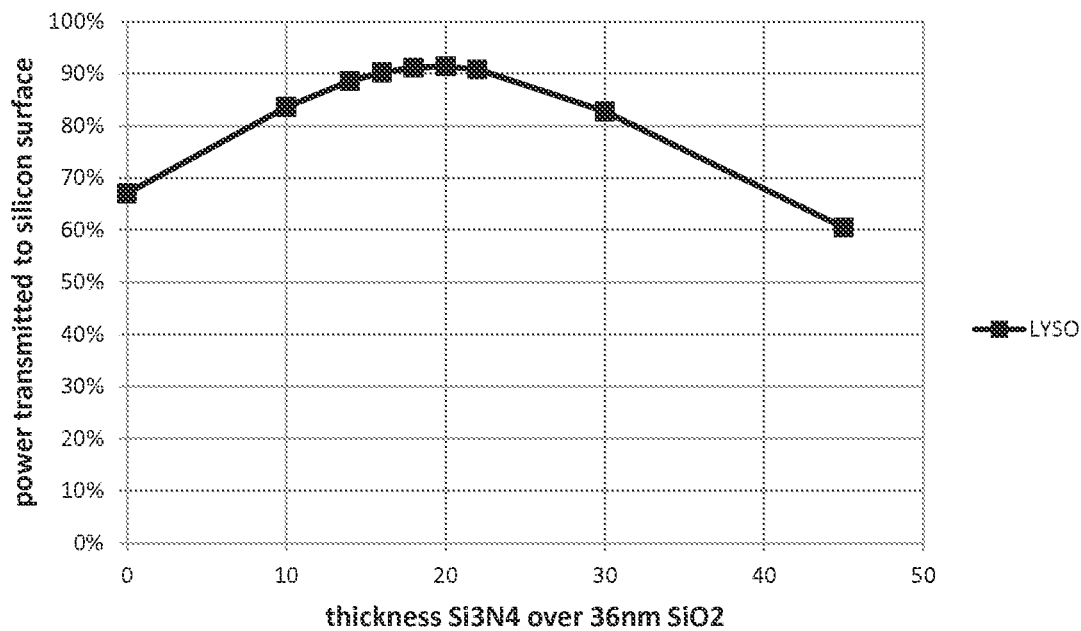
FIG. 10 is a simulated graph of a photomultiplier microcell optimised for LYSO(Ce) (centre wavelength 420 nm) showing an optimum thickness for a $Si_3N_4$ anti-reflective coating over a 36 nm thick insulating $SiO_2$ layer.
Figure 11:
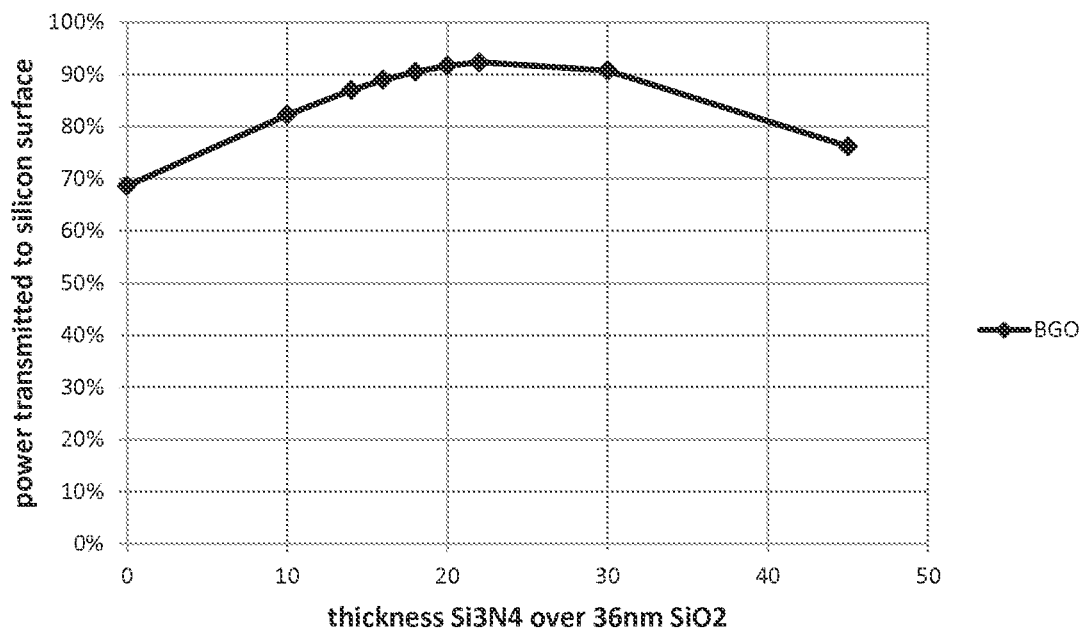
FIG. 11 is a simulated graph of a photomultiplier microcell optimised for BGO (centre wavelength 500 nm) showing an optimum thickness for a $Si_3N_4$ anti-reflective coating over a 36 nm thick insulating $SiO_2$ layer.
Figure 12:
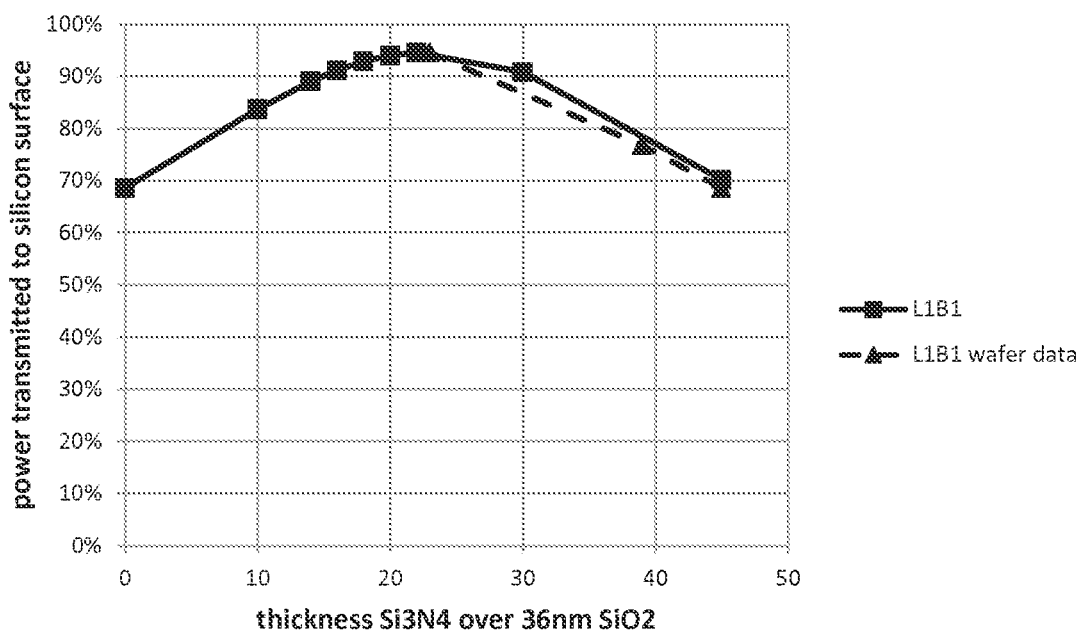
FIG. 12 is a simulated graph of a structure optimised for Blue Optical light wavelength 420 nm-520 nm) showing an optimum thickness for a $Si_3N_4$ anti-reflective coating over a 36 nm thick insulating $SiO_2$ layer.

FIG. 9 is a graph illustrating the photon detection efficiency (PDE) of a microcell plotted against the wavelength of light from 200 nm to 800 nm. The continuous line represents a PDE for a microcell in accordance with the present teaching with an insulating layer 301 retained over the active region 302 and consisting of two layers of material, namely, a first layer of silicon oxide with a thickness of 36 nm and a second layer silicon nitride with a thickness of 16 nm. The broken line represents a PDE for a prior art microcell that has the insulating layer 301 removed during processing and uses an anti-reflective coating of silicon nitride with a thickness of 45 nm over the active region 302. The maximum PDE of the continuous line and the broken line are substantially equivalent at the wavelength 400 nm which demonstrates that the PDE of the microcell may be optimised while retaining the insulating layer 301 by appropriately selecting an anti-reflective coating on top of insulating layer 301 which has an appropriate combination of materials The configuration of the SiPM device 200 is generally based on scintillation detection using crystal materials such as lutetium oxyorthosilicate (LSO) or LYSO (lutetium yttrium orthosilicate) or $LaBr_3$ (lanthanum (III) bromide) or BGO (bismuth germinate) or other. The scintillator materials are continuous or pixelated in manufacture and transfer the gamma ray or high-energy radiation collected into electromagnetic radiation whose spectral range matches the sensitivity of the photosensors. FIG. 10 is a simulated graph of a SiPM device optimised for LYSO(Ce) (wavelength 420 nm) showing an optimum thickness of 18 nm for a SiN anti-reflective coat over a 36 nm thick insulating layer 301. FIG. 11 is a simulated graph of a SiPM device optimised for BGO (wavelength 500 nm) showing an optimum thickness of 22 nm for a SiN anti-reflective coat over a 36 nm thick insulating layer 301. FIG. 12 is a simulated graph of a SiPM device optimised for blue optical wavelength range (420 nm-520 nm) showing an optimum thickness of 22 nm for a SiN anti-reflective coat over a 36 nm thick insulating layer 301. The broken line in FIG. 12 represents data obtained from the wafer, while the continuous line represents data output from a simulation. For FIGS. 10,11 and 12 the light output spectrum and photon detection efficiency are integrated to determine the total power transmitted into the structure converted into a measurable signal. The photon detection efficiency for each device structure is determined using real (refractive index) and imaginary (absorptive) optical properties from material data sheets, and light propagation is calculated using a transfer matrix method to accurately model interference and absorptive effects.

Figure 13:
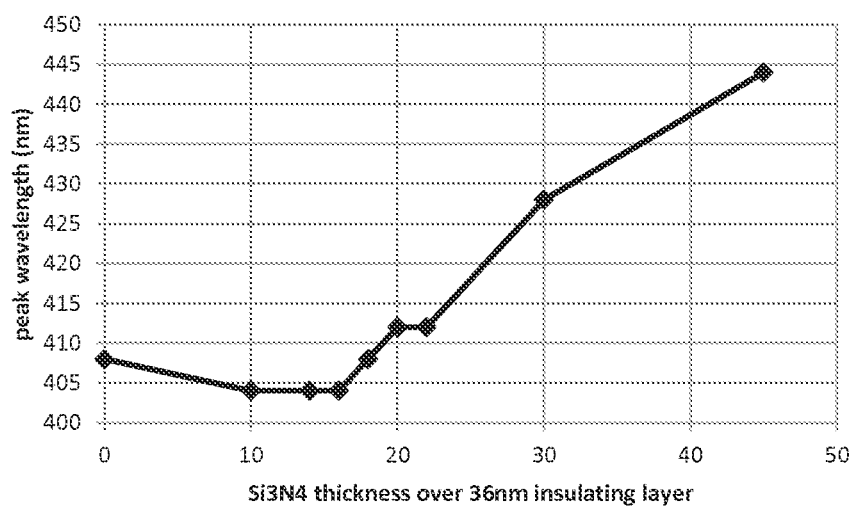
FIG. 13 is a simulated graph showing the variation of the peak wavelength with different anti-reflective coating thicknesses over a 36 nm insulating layer.

FIG. 13 is a simulated graph of a SiPM device showing the peak wavelength for a $SiN_4$ anti-reflective coating over a 36 nm thick insulating layer 301. For example, the optimum thickness for the $SiN_4$ anti-reflective coating optimised for a 444 nm insulating layer is approximately 45 nm. The optimum thickness for the $SiN_4$ anti-reflective coating optimised for a 428 nm is approximately 30 nm. Thus the graph of FIG. 13 may be used a quick reference guide for calculating the thickness of the anti-reflective coating by a cross referencing a point on the x-axis with a point on the y-axis.

It will be appreciated by the person of skill in the art that various modifications may be made to the above described embodiments without departing form the scope of the present invention. In this way it will be understood that the teaching is to be limited only insofar as is deemed necessary in the light of the appended claims. The term semiconductor photomultiplier is intended to cover any solid state photomultiplier device such as Silicon Photomultiplier [SiPM], MicroPixel Photon Counters [MPPC], MicroPixel Avalanche Photodiodes [MAPD] but is not limited to these examples.

Similarly the words comprises/comprising when used in the specification are used to specify the presence of stated features, integers, steps or components but do not preclude the presence or addition of one or more additional features, integers, steps, components or groups thereof.

We claim:

1. A semiconductor photomultiplier having an array of microcells, each microcell comprising:
    an active region;
    a photosensitive diode having a PN junction in the active region;
    an insulating layer over the active region;
    a dielectric layer over a first portion of the insulating layer but not over a second portion of the insulating layer different from the first portion, the second portion defining a trench forming an optical pathway for transmission of light to the photosensitive diode in the active region; and an anti-reflective coating formed on the second portion of the insulating layer in the optical pathway, wherein each of the insulating layer and the anti-reflective coating overlies the entire trench.

2. The semiconductor photomultiplier of claim 1 further comprising an epitaxial layer intermediate the insulating layer and a substrate.

3. The semiconductor photomultiplier of claim 2, wherein the insulating layer is formed directly on the epitaxial layer.

4. The semiconductor photomultiplier of claim 1, wherein the insulating layer is formed directly on a surface of a silicon substrate.

5. The semiconductor photomultiplier of claim 1, wherein the insulating layer comprises an oxide material.

6. The semiconductor photomultiplier of claim 1, wherein the anti-reflective coating comprises multiple layers of two or more materials.

7. The semiconductor photomultiplier of claim 6, wherein the anti-reflective coating comprises a combination of silicon dioxide ($SiO_2$) and silicon nitride ($Si_3N_4$).

8. The semiconductor photomultiplier of claim 7, wherein the anti-reflective coating comprises a layer of 144 nm thick $SiO_2$ and a layer of 45 nm thick $Si_3N_4$.

9. The semiconductor photomultiplier of claim 6, wherein the anti-reflective coating comprises a layer of 36 nm thick SiO and a layer of 16 nm thick SiN.

10. The semiconductor photomultiplier of claim 1, wherein the anti-reflective coating has a thickness of about ¼ of a wavelength of interest divided by a refractive index of the anti-reflective coating.

11. The semiconductor photomultiplier of claim 10, wherein the refractive index of the anti-reflective coating is between a refractive index of silicon and a refractive index of the insulating layer.

12. The semiconductor photomultiplier of claim 11, wherein the refractive index of the anti-reflective coating is a geometric mean of the refractive index of silicon and the refractive index of the insulating layer.

13. A semiconductor photomultiplier comprising a plurality of microcells, each microcell comprising:

an active region having a photosensitive diode having a PN junction formed therein;

an insulating layer over the PN junction of the photosensitive diode and directly above the active region;

an anti-reflective coating on the insulating layer; and a dielectric layer overlying a first portion of the active region having an interconnect to the active region formed therein but not over a second portion of the insulating layer different from the first portion, the second portion defining a trench forming an optical window overlying the anti-reflective coating, a portion of the insulating layer, and said second portion of the active region, wherein each of the insulating layer and the anti-reflective coating overlies the entire trench.

14. The semiconductor photomultiplier of claim 13, wherein the anti-reflective coating comprises multiple layers of two or more materials.

15. The semiconductor photomultiplier of claim 14, wherein the anti-reflective coating comprises a combination of silicon dioxide ($SiO_2$) and silicon nitride ($Si_3N_4$).

16. The semiconductor photomultiplier of claim 15, wherein the anti-reflective coating comprises a layer of 144 nm thick $SiO_2$ and a layer of 45 nm thick $Si_3N_4$.

17. The semiconductor photomultiplier of claim 14, wherein the anti-reflective coating comprises a layer of 36 nm thick SiO and a layer of 16 nm thick SiN.

18. The semiconductor photomultiplier of claim 13, wherein the anti-reflective coating has a thickness of about ¼ of a wavelength of interest divided by a refractive index of the anti-reflective coating.

19. The semiconductor photomultiplier of claim 18, wherein the refractive index of the anti-reflective coating is between a refractive index of silicon and a refractive index of the insulating layer.

20. The semiconductor photomultiplier of claim 19, wherein the refractive index of the anti-reflective coating is a geometric mean of the refractive index of silicon and the refractive index of the insulating layer.

\* \* \* \* \*